United States Patent [19]

Igura

[11] Patent Number: 5,671,186
[45] Date of Patent: Sep. 23, 1997

[54] SEMICONDUCTOR MEMORY DEVICE HAVING BIT LINE PRECHARGER

[75] Inventor: Koichi Igura, Kasugai, Japan

[73] Assignee: Fujitsu Limited, Kawasaki, Japan

[21] Appl. No.: 457,588

[22] Filed: Jun. 1, 1995

[30] Foreign Application Priority Data

Jun. 17, 1994 [JP] Japan .................. 6-136143

[51] Int. Cl.$^6$ .................................. G11C 7/00
[52] U.S. Cl. ............... 365/203; 365/204; 365/185.25
[58] Field of Search ..................... 365/203, 202, 365/204, 205, 185.25

[56] References Cited

U.S. PATENT DOCUMENTS

| | | | |
|---|---|---|---|
| 4,879,682 | 11/1989 | Engles | 365/203 |
| 4,943,945 | 7/1990 | Lai | 365/203 |
| 5,175,705 | 12/1992 | Iwahashi | 365/185.25 |
| 5,309,401 | 5/1994 | Suzuki et al. | 365/203 |

OTHER PUBLICATIONS

Roubik Gregorian et al., Integrated Circuits For Signal Processing, 3 pages, 1986, John Wiley & Sons, Inc.
John P. Uyemura, Fundamentals of MOS Digital Integrated Circuits, 5 pages, 1988, Addison–Wesley Publishing Company.

Primary Examiner—David C. Nelms
Assistant Examiner—F. Niranjan
Attorney, Agent, or Firm—Staas & Halsey

[57] ABSTRACT

A semiconductor memory device includes a bit line, a memory cell, and a precharge circuit responsive to a precharge signal for charging the bit line. The precharge circuit is enabled before cell data is read from the memory cell via the precharged bit line. The memory device further includes a potential controller responsive to the precharge signal for regulating the charge applied to the bit line by the precharge circuit. A charge supplying circuit is coupled to the bit line, and maintains the bit line potential at a predetermined voltage level by providing the bit line with charges during a period from when the precharge circuit completes its precharge operation to when the bit line potential changes in response to reading data from the memory cell.

18 Claims, 3 Drawing Sheets

SEMICONDUCTOR MEMORY DEVICE HAVING BIT LINE PRECHARGER

BACKGROUND OF THE INVENTION

1. Field of the Invention

The present invention relates generally to a semiconductor memory device having a bit line precharger, and, in particular, to circuitry that reads data from individual memory cells in the semiconductor memory device.

2. Description of the Related Art

One type of technology which has made it possible to construct increasingly small semiconductor memory devices is low power circuitry. Circuitry designed around this type of technology generates far less heat and needs fewer or smaller components than circuits based on older, more conventional, designs. However, with the range of voltage supply levels used in low power circuitry, it is essential to ensure that each component of the semiconductor functions properly within a range of low voltage levels. In particular, for semiconductor memory devices, it is important that the circuitry used to read data from the individual memory cells be capable of operating at low voltage levels.

Data reading circuitry for one popular type of semiconductor memory device, the Erasable Programmable Read Only Memory (EPROM), is shown in FIG. 1. In this circuit, a P channel MOS transistor Tr1 precharges a bit line BL at a time just prior to when data is read from an associated EPROM's memory cell formed by a pair of cell transistors 2.

The transistor Tr1 has a source connected to a power supply $V_{cc}$ (3 to 5 volts), a gate supplied with a precharge signal PS and a drain connected to the input terminal of a hysteresis inverter 1a. The output of the hysteresis inverter 1a is input to a second inverter 1b which provides data $D_{out}$ at its output terminal. The drain of the transistor Tr1 is further connected to the drain of an N channel MOS transistor Tr2. The transistor Tr2 has a gate supplied with a control signal CS. The bit line BL connects the source of the transistor Tr2 to the drains of two cell transistors 2. The two cell transistors 2 form an EPROM cell as a memory cell 20. A gate control signal GC is supplied to the gates of the cell transistors 2 via a word line (not shown). During the time data is written to the memory cell 20, the gate signal GC is set to a high voltage of about 12.5 volts. During the time data is read from the memory cell 20, the gate signal GC is set to approximately 5 volts. The sources of both cell transistors 2 are grounded. An N channel MOS transistor Tr3 is provided to control the data writing operations. The transistor Tr3 has a source connected to the bit line BL, a gate supplied with a write control signal WS and a drain connected to another power supply $V_{pp}$. Power supply $V_{pp}$ is set at a higher voltage (e.g., 8 volts) than the power supply $V_{cc}$ (3 to 5 volts).

When data is written to the memory cell 20, a low level control signal CS (e.g., 0–2.5 volts) input to the gate of the transistor Tr2 switches the transistor Tr2 off. At the same time, a high level control signal WS (e.g., 3–6 volts) input to the gate of the transistor Tr3 switches the transistor Tr3 on. With the transistor Tr2 off and the transistor Tr3 on, the supply voltage $V_{pp}$ is applied to the drains of the cell transistors 2 via the transistor Tr3 and the bit line BL. Each cell transistor 2 is designed such that its threshold voltage is variable. Threshold voltage is the minimum amount of voltage necessary for a field effect transistor to switch on. When a 12.5 volts gate signal GC is applied to the gate of each cell transistor 2, the cell transistor 2 is charged by the power supply $V_{pp}$ so that the threshold voltage of the cell transistor 2 is set to a high threshold voltage (VthH) that is higher than a normal threshold voltage (VthN) between the gate and source of the cell transistor 2. In contrast, if the cell transistor 2 is not charged by the power supply $V_{pp}$ or is empty of electron charges, the threshold voltage of the cell transistor 2 is maintained at the normal threshold voltage (VthN).

During the EPROM's precharge operation performed just prior to the time data is read from the memory cell, a low voltage precharge signal PS is input to the gate of the transistor Tr1 and a high voltage control signal CS is input to the gate of the transistor Tr2. This allows the transistors Tr1 and Tr2 to switch on, precharging the bit line BL to a voltage potential lower than the supply voltage $V_{cc}$. The amount by which the potential of the supply voltage $V_{cc}$ exceeds the potential of the precharged bit line BL is the sum of the threshold voltages of the transistors Tr1 and Tr2. Since the input signal to the hysteresis inverter 1a is high, the output data $D_{out}$ from the inverter 1b goes high.

During the time data is read from the memory cell 20, the precharge signal PS goes high, turning off the transistor Tr1. The transistor Tr2 remains on. A 5 volt gate control signal GC, input to the gates of the cell transistors 2, selects those cell transistors 2. When the cell transistors 2 are not charged, those cell transistors 2 are turned on in response to the 5 volt gate control signal GC. This causes a low level input signal to be applied to the hysteresis inverter 1a. As a result, the inverter 1b outputs an output data signal $D_{out}$ low. In contrast, when the cell transistors 2 are charged, those cell transistors 2 remains off even if receiving the 5 volt gate control signal GC. Accordingly, the level of the signal input to the hysteresis inverter 1a is kept high at the precharge potential, effecting a high level output of signal $D_{out}$ from the inverter 1b.

In the conventional EPROMs, increasing the period of the read cycle causes an increase in the period during which the bit line BL is kept at precharge voltage level. Cell transistors 2, therefore, have a precharge voltage signal applied to their drains for an extended period of time. This often causes data in the memory cell 20 to be changed to erroneous data. Consequently, it is necessary to limit the time period during which the bit line BL is kept at a precharge voltage level.

Due to a current trend in the semiconductor industry to use a lower supply voltage for $V_{cc}$, current memory device designs use precharge voltages at levels lower than conventional precharge voltage levels. Even if the cell transistors 2 are kept off during the time data is read from a memory cell, the potential level of the input signal to the hysteresis inverter 1a may drop, reducing the speed at which the H-level output data $D_{out}$ is read from the EPROM.

If the precharge voltage is set low, the precharge potential of the bit line BL decreases over time, even with the cell transistors 2 kept off during the data read cycle. Any decrease in the precharge voltage level seen by the hysteresis inverter 1a may appear to be a low potential signal, causing the output of data signal $D_{out}$ from the inverter 1b to be low when it should be high.

With different supply voltages, it is difficult to set the threshold voltage of the hysteresis inverter 1a to produce a stable output signal. As a result, this makes memory cell data reading operations unpredictable and difficult to perform.

SUMMARY OF THE INVENTION

Accordingly, it is a primary objective of the present invention to provide a semiconductor memory device that allows memory cell data to be read from the memory cells of the memory device, despite having a wide range of supply voltages applied to various components of the memory device.

To achieve the foregoing and other objects and in accordance with the purpose of the present invention, an improved semiconductor memory device is provided.

A first semiconductor memory device according to the present invention, as shown in FIG. 2A, includes a bit line BL, a memory cell 20 for storing cell data, a potential controller 5 and a precharge circuit 6. In response to a precharge signal PS, the precharge circuit 6 precharges the bit line BL prior to reading cell data from the memory cell 2 via the precharged bit line BL. The potential controller 5 is responsive to the precharge signal PS and regulates the voltage applied by the precharge circuit 6 to the bit line BL. The potential controller 5 operates in synchronism with the charging of the bit line BL by the precharge circuit 6.

A second semiconductor memory device according to the present invention, as shown in FIG. 2B, includes a bit line BL, a memory cell 20 for storing cell data, a charge supplying circuit 3 and a precharge circuit 6. In response to a precharge signal PS, the precharge circuit 6 precharges the bit line BL prior to reading cell data from the memory cell 2 via the precharged bit line BL. The charge supplying circuit 3 maintains the potential of the bit line BL by providing the bit line BL with additional charges during a period from when the precharge circuit 6 completes its precharge operation to when the bit line voltage level changes in response to reading data from the memory cell.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 1:
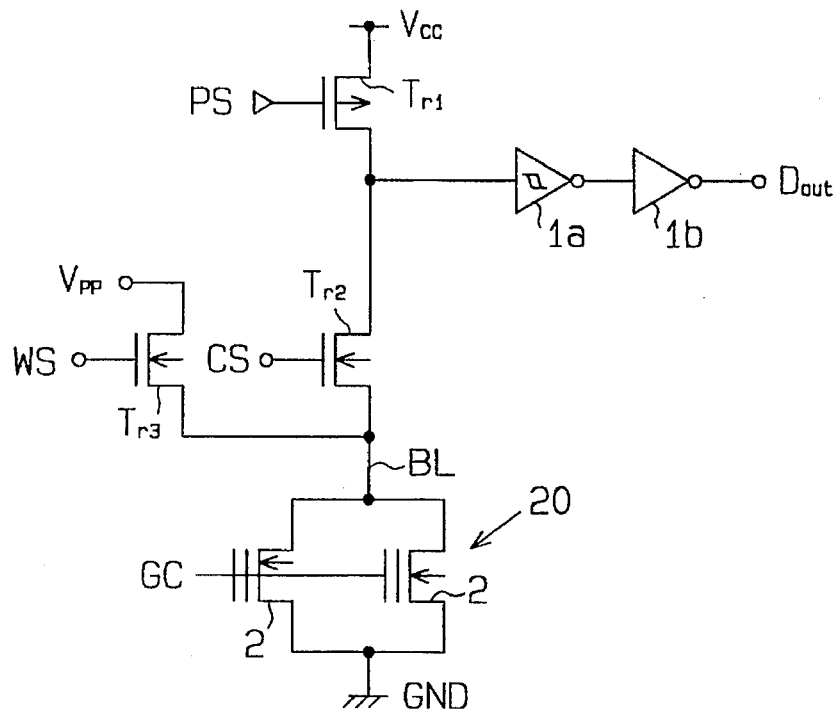
FIG. 1 is a circuit diagram illustrating a conventional data reading circuit of an EPROM.
Figure 2A:
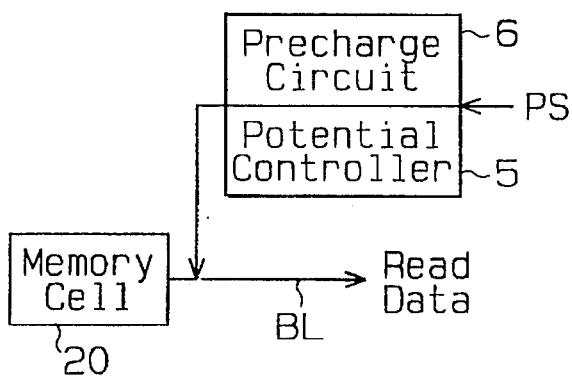
FIGS. 2A and 2B are block circuit diagrams illustrating essential elements of preferred embodiments of the present invention.
Figure 2B:
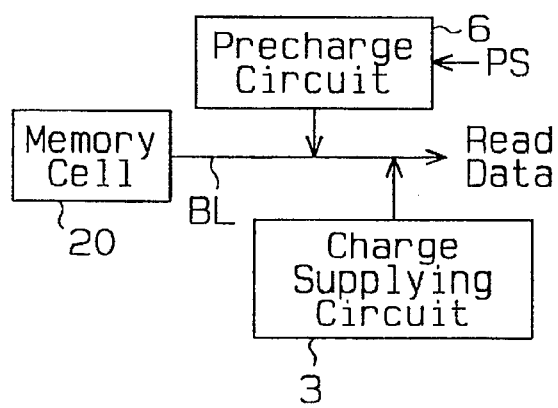
Figure 3:
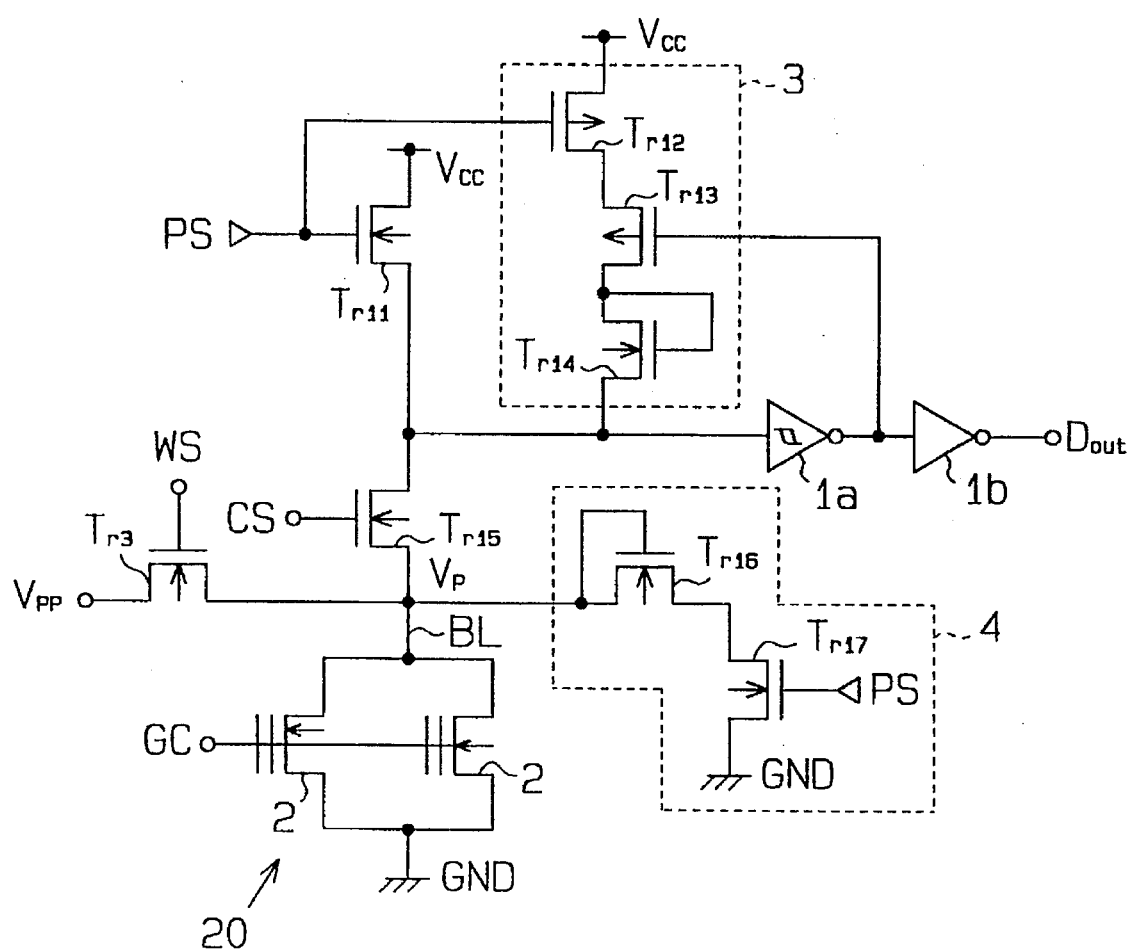
FIG. 3 is a circuit diagram illustrating a first embodiment of the present invention.

FIG. 3 shows in detail one preferred embodiment of a circuit used to read data from a memory cell of an EPROM according to the present invention. Like or same reference numerals as used for the above-described related art will also be used to denote corresponding or identical components in the following description.

An N channel MOS transistor Tr11, provided to precharge a bit line BL, has a drain connected to a power supply $V_{cc}$ ranging from approximately 3 to 5 volts, a gate supplied with a precharge signal PS and a source connected to the input terminal of a hysteresis inverter 1a. The output signal of the hysteresis inverter 1a is sent to an inverter 1b which produces output data $D_{out}$ at its output terminal. The source of the transistor Tr11 is also connected to the drain of an N channel MOS transistor Tr15, provided here as a thick film transistor. The transistor Tr15 has a gate that receives a control signal CS and a source connected via the bit line BL to the drains of two cell transistors 2 in the EPROM. The two cell transistors 2 form an EPROM cell 20 as a memory cell. A gate control signal GC is provided to the gates of the memory cell transistors 2. Each of the cell transistors 2 has a grounded terminal.

The data reading circuit further includes an N channel MOS transistor Tr3 for writing control. The transistor Tr3 has a source connected to the bit line BL, a gate supplied with a write control signal WS and a drain connected to another power supply $V_{pp}$ set at a voltage (e.g., 8V) higher than the power supply $V_{cc}$.

A P channel MOS transistor Tr12 has a gate that receives the precharge signal PS, a source connected to the power supply $V_{cc}$ and a drain connected to the source of a P channel MOS transistor Tr13. The transistor Tr13 has a gate connected to the output terminal of the hysteresis inverter 1a and a drain connected to the drain of an N channel MOS transistor Tr14. The transistor Tr14 has a gate connected to its own drain and a source connected to the input terminal of the hysteresis inverter 1a. A feedback circuit 3, formed by the transistors Tr12, Tr13 and Tr14, functions as a charge supplying circuit. The charge supplying ability of the feedback circuit 3 is sufficiently smaller than the load driving ability of each cell transistor 2.

An N channel MOS transistor Tr16, also a thick film transistor, has a drain and gate connected to the bit line BL and a source connected to the drain of an N channel MOS transistor Tr17. The transistor Tr17 has a gate supplied with the precharge signal PS and a grounded source. The transistors Tr16 and Tr17 form a control circuit 4 which controls a precharge voltage $V_p$ applied to the cell transistors 2. High level precharge signal PS as well as high control signal CS have potentials equal to the supply voltage $V_{cc}$.

Data writing operations to the cell transistors 2 of the EPROM in this embodiment are carried out in the same manner as that of the conventional EPROM. During the precharge operation, just prior to the data reading operation, high precharge signals PS are input to the gates of the transistors Tr11 and Tr17 while a high control signal CS is input to the gate of the transistor Tr15. Consequently, the transistors Tr11, Tr15, Tr16 and Tr17 turn on. When the transistor Tr11 turns ON, the potential level of the input signal to the hysteresis inverter 1a is set lower than the potential of the supply voltage $V_{cc}$ by an amount equal to the threshold voltage of the transistor Tr11. When the transistors Tr15 to Tr17 are switched on, the precharge voltage $V_p$ of the bit line BL is set to a potential obtained by dividing the potential difference between the supply voltage $V_{cc}$ and the ground level potential GND by the combined resistances of the series-connected transistors Tr11 and Tr15 and the combined resistances of the series-connected transistors Tr16 and Tr17. By properly setting the resistances of the individual transistors Tr11, Tr15, Tr16 and Tr17 when turned on, it is possible to apply precharge voltage $V_p$ to the bit line BL at an optimal potential level (e.g., 2V). This prevents the cell transistors 2 from being charged with an excessively high precharge voltage.

With lower supply voltages such as $V_{cc}$ being used, care should be taken to reduce the precharge voltage $V_p$. Typically, the precharge voltage $V_p$ or the drain potential of the transistor Tr16 decreases, with its threshold voltage defined between the gate and source of the transistor Tr16 set relatively higher than the drain potential. Consequently, the transistor Tr16 turns off to prevent the precharge voltage $V_p$ from being reduced. When such operation occurs, the input signal to the hysteresis inverter 1a goes high causing the inverter 1b to output the signal data $D_{out}$ high.

During the reading operation, the precharge signal PS is set low. This turns the transistors Tr11 and Tr17 off and the transistor Tr12 on. The transistor Tr15 stays turned on. Since the input signal to the hysteresis inverter 1a is set high during the precharge operation, the output signal of the hysteresis inverter 1a goes low and turns the transistors Tr13 and Tr14 on. Consequently, all of the transistors Tr12, Tr13 and Tr14 are turned on, allowing the input terminal of the hysteresis inverter 1a to be connected to the power supply $V_{cc}$. This prevents the attenuation of the input signal to the inverter 1a.

When those cell transistors 2 are selected, the 5 volt gate control signal GC is input to the gate of the cell transistors 2. The two cell transistors 2 forming a memory cell store electrons in accordance with cell data. When the cell transistors 2 are not charged, the cell transistors 2 are turned on by receiving the 5 volt gate control signal GC. Then, the input signal to the hysteresis inverter 1a is set low and the inverter 1b outputs the output data signal $D_{out}$ low. When this happens, the output signal of the hysteresis inverter circuit 1a is set high, turning the transistor Tr13 off. This causes the feedback circuit 3 to stop functioning. In contrast, when the cell transistors 2 are charged, the cell transistors 2 remain off even if the 5 volt gate control signal GC is provided to their gates. In this case, the feedback circuit 3 maintains a high level input to the terminal of the hysteresis inverter 1a, forcing a high level output data signal $D_{out}$ from the inverter 1b.

According to the first embodiment, the precharge voltage $V_p$ supplied to the bit line BL is regulated by the transistors Tr11 and Tr15 and the control circuit 4, thus preventing unnecessary charging of the cell transistors 2 in the precharge operation.

Even if the supply voltage $V_{cc}$ is reduced, the control circuit 4 can keep the precharge potential and the feedback circuit 3 can prevent the precharge potential from degrading during the time data is read from a memory cell. This allows for an increase in cell data reading operations and prevents erroneous data from being output from the EPROM.

Figure 4:
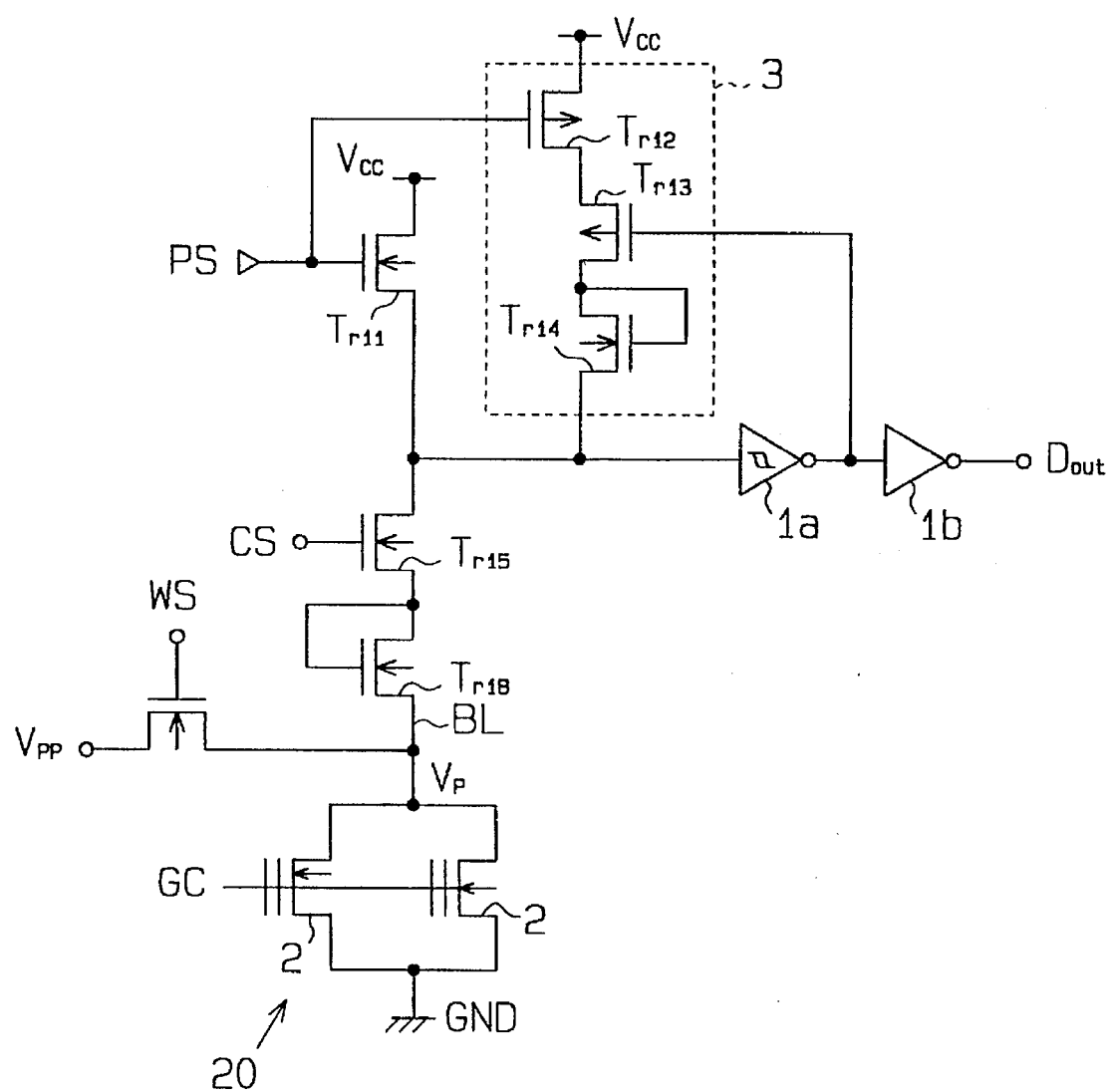
FIG. 4 is a circuit diagram illustrating a second embodiment of the present invention.

FIG. 4 shows a reading circuit for an EPROM according to a second embodiment of the present invention. This embodiment is substantially the same as the first embodiment except that the control circuit 4 of the first embodiment is omitted and a depletion type N channel MOS transistor Tr18 is provided between the transistor Tr15 and the cell transistors 2. The transistor Tr18 has its gate and drain connected together.

According to the second embodiment, the precharge voltage $V_p$ applied to the cell transistors 2 is set lower than the supply voltage $V_{cc}$ by the sum of the threshold voltages of the transistors Tr11, Tr15 and Tr18. This prevents the unnecessary charging of the cell transistors 2 in the precharge operation. Further, the feedback circuit 3 can prevent the attenuation of the precharge voltage $V_p$ during the time memory cell data is read, as per the first embodiment.

Although only two embodiments of the present invention have been described herein, it should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope of the appended claims.

What is claimed is:

1. A semiconductor memory device comprising:
   a memory cell including a cell transistor having a control gate, for storing cell data based on charges accumulated in the control gate of said cell transistor;
   a bit line connected to said memory cell;
   a precharge circuit responsive to a precharge signal being set one of high and low, for charging said bit line before the cell data is read from said memory cell and maintaining charging of said bit line in response to said precharge signal being set as the other of said high and low; and
   a potential control circuit responsive to said precharge signal for restricting the supply of charges applied to said bit line by said precharge circuit, said potential control circuit operating synchronously with the charging of said bit line by said precharge circuit.

2. The semiconductor memory device according to claim 1, wherein said precharge circuit includes a transistor having a control terminal for receiving said precharge signal.

3. The semiconductor memory device according to claim 1, wherein said potential control circuit comprises a plurality of series connected transistors including one transistor provided between a high-potential power supply and said bit line and another transistor provided between said bit line and a low-potential power supply.

4. The semiconductor memory device according to claim 1, wherein said potential control circuit includes a depletion type MOS transistor provided between said precharge circuit and said memory cell, said depletion type MOS transistor having a gate and a drain connected together.

5. A semiconductor memory device comprising:
   a memory cell including a cell transistor having a control gate, for storing cell data based on charges accumulated in the control gate of said cell transistor;
   a bit line connected to said memory cell;
   a precharge circuit responsive to a precharge signal being set one of high and low, for charging said bit line before cell data is read from said memory cell and maintaining charging of said bit line in response to said precharge signal being set as the other of said high and low; and
   a charge supplying circuit coupled to said bit line for maintaining the potential of said bit line at a predetermined voltage level by providing said bit line with charges during a period from when said precharge circuit completes charging said bit line to when the potential of said bit line changes in response to reading data from said memory cell.

6. The semiconductor memory device according to claim 5, wherein said precharge circuit includes a transistor having a control terminal for receiving said precharge signal.

7. The semiconductor memory device according to claim 5 further comprising a hysteresis inverter as an output control circuit for detecting changeable bit line potential corresponding to the potential of charges stored in said memory cell and for producing an output in accordance with the detected potential; and
   wherein said charge supplying circuit is provided between a power supply and said bit line and in parallel to said hysteresis inverter, and operates in response to the output of said hysteresis inverter based on the bit line potential when said memory cell is charged in a mode in which cell data is read, whereby the bit line potential is maintained at said predetermined voltage level with power from said power supply.

8. A semiconductor memory device comprising:

a cell transistor;

a bit line connected to said cell transistor;

a precharge circuit for applying a predetermined precharge voltage to said bit line; and a data output controller for detecting changeable bit line potential corresponding to the potential of charges stored in said cell transistor and for producing an output in accordance with the detected potential during the time cell data is read from said cell transistor, wherein said precharge circuit includes:

a switch circuit, connected between a first power supply of a predetermined supply voltage and said bit line, for selectively connecting said bit line to said power supply in response to a precharge signal; and a voltage control circuit connected to said bit line, wherein said voltage control circuit operates in response to said precharge signal to produce the predetermined precharge voltage that is lower than the supply voltage of said power supply.

9. The semiconductor memory device according to claim 8, wherein said voltage control circuit includes at least one MOS transistor enabled in response to said precharge signal.

10. The semiconductor memory device according to claim 8, wherein said voltage control circuit comprises a plurality of series connected transistors including a first transistor provided between said first power supply and said bit line and a second transistor provided between said bit line and a second power supply having a lower potential than that of said supply voltage of said first power supply.

11. The semiconductor memory device according to claim 10, wherein said second power supply has a ground level potential.

12. A semiconductor memory device comprising:

a memory cell for storing cell data;

a bit line connected to said memory cell;

a precharge circuit responsive to a precharge signal for charging said bit line before cell data is read from said memory cell; and a potential control circuit responsive to said precharge signal for restricting the supply of charges applied to said bit line by said precharge circuit, said potential control circuit operating synchronously with the charging of said bit line by said precharge circuit, wherein said potential control circuit comprises a plurality of series connected transistors including one transistor provided between a high-potential power supply and said bit line and another transistor provided between said bit line and a low-potential power supply.

13. A semiconductor memory device comprising:

a memory cell for storing cell data;

a bit line connected to said memory cell;

a precharge circuit responsive to a precharge signal for charging said bit line before cell data is read from said memory cell; and a potential control circuit responsive to said precharge signal for restricting the supply of charges applied to said bit line by said precharge circuit, said potential control circuit operating synchronously with the charging of said bit line by said precharge circuit, wherein said potential control circuit includes a depletion type MOS transistor provided between said precharge circuit and said memory cell, said depletion type MOS transistor having a gate and a drain connected together.

14. A semiconductor memory device comprising:

a memory cell for storing cell data;

a bit line connected to said memory cell;

a precharge circuit responsive to a precharge signal for charging said bit line before cell data is read from said memory cell;

a charge supplying circuit coupled to said bit line for maintaining the potential of said bit line at a predetermined voltage level by providing said bit line with charges during a period from when said precharge circuit completes charging said bit line to when the potential of said bit line changes in response to reading data from memory cell; and a hysteresis inverter as an output control circuit for detecting changeable bit line potential corresponding to the potential of charges stored in said memory cell and for producing an output in accordance with the detected potential, wherein said charge supplying circuit is provided between a power supply and said bit line and in parallel to said hysteresis inverter, and operates in response to the output of said hysteresis inverter based on the bit line potential when said memory cell is charged in a mode in which cell data is read, the bit line potential being maintained at said predetermined voltage level with power from said power supply.

15. A semiconductor memory device comprising:

a cell transistor;

a bit line connected to said cell transistor;

a precharge circuit for applying a predetermined precharge voltage to said bit line;

a data output controller, including a hysteresis inverter, for detecting changeable bit line potential corresponding to the potential of charges stored in said cell transistor and for producing an output in accordance with the detected potential during the time cell data is read from said cell transistor;

a switch circuit, connected between a first power supply of a predetermined supply voltage and said bit line, for selectively connecting said bit line to said power supply in response to a precharge signal; and a voltage control circuit connected to said bit line, wherein said voltage control circuit operated in response to said precharge signal to produce the predetermined precharge voltage that is lower than the supply voltage of said power supply.

16. A semiconductor memory device comprising:

a cell transistor;

a bit line connected to said cell transistor;

a precharge circuit for applying a predetermined precharge voltage to said bit line;

a data output controller for detecting changeable bit line potential corresponding to the potential of charges stored in said cell transistor and for producing an output in accordance with the detected potential during the time cell data is read from said cell transistor;

a switch circuit, connected between a first power supply of a predetermined supply voltage and said bit line, for selectively connecting said bit line to said power supply in response to a precharge signal; and a voltage control circuit connected to said bit line, wherein said voltage control circuit operated in response to said precharge signal to produce the predetermined precharge voltage that is lower than the supply voltage of said power supply, wherein said voltage control circuit includes a depletion type MOS transistor provided between said switch circuit and said cell transistor, said depletion type MOS transistor having a gate and a drain connected together.

17. A semiconductor memory device comprising:

a cell transistor;

a bit line connected to said cell transistor;

a precharge circuit for applying a predetermined precharge voltage to said bit line;

a data output controller including a hysteresis inverter for detecting changeable bit line potential corresponding to the potential of charges stored in said cell transistor and for producing an output in accordance with the detected potential during the time cell data is read from said cell transistor;

a switch circuit, connected between a first power supply of a predetermined supply voltage and said bit line, for selectively connecting said bit line to said power supply in response to a precharge signal;

a voltage control circuit connected to said bit line, wherein said voltage control circuit operated in response to said precharge signal to produce the predetermined precharge voltage that is lower than the supply voltage of said power supply; hysteresis inverter; and a feedback circuit, connected in parallel to said hysteresis inverter, operating in response to the output of said hysteresis inverter based on the bit line potential when said cell transistor is charged in a mode in which cell data is read, whereby the potential of said bit line is maintained at a predetermined voltage level.

18. A semiconductor memory device comprising:

a bit line to read out stored data from a memory cell;

a precharge circuit responsive to a first precharge signal to charge said bit line before the data is read from said memory cell, and to maintain charge on said bit line when said first precharge signal changes to a second precharge signal; and a charge supply circuit to maintain a predetermined voltage level on said bit line by providing charge when said precharge circuit completes charge of said bit line and by not providing charge during change in bit line potential during read out of the stored data from said memory cell.

* * * * *